US012665383B2

(12) United States Patent
Enomoto et al.

(10) Patent No.:  US 12,665,383 B2
(45) Date of Patent:       Jun. 23, 2026

(54) BASE MEMBER OR LIGHT-EMITTING DEVICE

(71) Applicant: NICHIA CORPORATION, Anan (JP)

(72) Inventors: Kiyoshi Enomoto, Komatsushima (JP); Eiichiro Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 1073 days.

(21) Appl. No.: 17/696,349

(22) Filed: Mar. 16, 2022

(65) Prior Publication Data

US 2022/0302672 A1     Sep. 22, 2022

(30) Foreign Application Priority Data

Mar. 19, 2021    (JP) ................................. 2021-045993
Nov. 29, 2021    (JP) ................................. 2021-193206

(51) Int. Cl.
*H01S 5/0239*          (2021.01)
*H01S 5/02208*        (2021.01)
(Continued)

(52) U.S. Cl.
CPC ........ *H01S 5/0239* (2021.01); *H01S 5/02208* (2013.01); *H01S 5/02315* (2021.01); *H01S 5/02345* (2021.01); *H01S 5/4031* (2013.01); *H01S 5/4093* (2013.01); *H01S 5/02253* (2021.01); *H01S 5/02255* (2021.01); *H01S 5/06825* (2013.01)

(58) Field of Classification Search
CPC ............. H01S 5/02345; H01S 5/02255; H01S 5/02325; H01S 5/02326; H01S 5/02375–0239; H01S 5/4093; H01S 5/02208; H01S 5/02216; H05K 5/0247; H05K 5/0091; H05K 5/0052; H05K 2201/1034
See application file for complete search history.

(56) References Cited

U.S. PATENT DOCUMENTS 5,436,997 A       7/1995   Makiuchi et al.
2003/0012525 A1  1/2003   Takagi
(Continued)

FOREIGN PATENT DOCUMENTS

JP         H06-204566 A       7/1994
JP         2003-031886 A      1/2003
(Continued)

*Primary Examiner* — Sean P Hagan
(74) *Attorney, Agent, or Firm* — Spencer Fane LLP

(57)          ABSTRACT

A base member includes a lower portion and a lateral portion. The lateral portion includes a first lateral surface, a second lateral surface not adjacent to the first lateral surface, and a third lateral surface adjacent to the first lateral surface, and first to third step portions. The first step portion is arranged inward of the first lateral surface along a portion or an entirety of the first lateral surface, and has a first upper surface provided with a wiring pattern. The second step portion is arranged inward of the second lateral surface along a portion or an entirety of the second lateral surface, and has a second upper surface provided with a wiring pattern. The third step portion is arranged inward of the third lateral surface along only a portion of the third lateral surface, and has a third upper surface provided with a wiring pattern.

13 Claims, 9 Drawing Sheets

(51) Int. Cl.

| | |
|---|---|
| *H01S 5/02253* | (2021.01) |
| *H01S 5/02255* | (2021.01) |
| *H01S 5/02315* | (2021.01) |
| *H01S 5/02345* | (2021.01) |
| *H01S 5/40* | (2006.01) |
| H01S 5/068 | (2006.01) |

(56) References Cited

U.S. PATENT DOCUMENTS

| | | | | |
|---|---|---|---|---|
| 2019/0305512 | A1 | 10/2019 | Kitajima | |
| 2019/0371971 | A1 | 12/2019 | Kozuru et al. | |
| 2020/0036158 | A1* | 1/2020 | Miyata | H01S 5/06825 |
| 2020/0083664 | A1* | 3/2020 | Miura | H01S 5/4037 |
| 2020/0185877 | A1* | 6/2020 | Kawaguchi | H01S 5/02326 |
| 2021/0218221 | A1 | 7/2021 | Kitajima | |

FOREIGN PATENT DOCUMENTS

| | | | |
|---|---|---|---|
| JP | 2006-261208 | A | 9/2006 |
| JP | 2010-069620 | A | 4/2010 |
| JP | 2010-129951 | A | 6/2010 |
| JP | 2010-154177 | A | 7/2010 |
| JP | 2012-009631 | A | 1/2012 |
| JP | 2019-175903 | A | 10/2019 |
| JP | 2019-212752 | A | 12/2019 |

* cited by examiner

BASE MEMBER OR LIGHT-EMITTING DEVICE

CROSS-REFERENCE TO RELATED APPLICATION

This application claims priority to Japanese Patent Application No. 202145993 filed on Mar. 19, 2021, and Japanese Patent Application No. 2021-193206 filed on Nov. 29, 2021, the disclosures of which are hereby incorporated herein by reference in their entirety.

BACKGROUND OF THE INVENTION

1. Field of the Invention

The present invention relates to a base member or a light-emitting device.

2. Description of Related Art

Japanese Unexamined Patent Application Publication No. 2019-212752 discloses a package including a base member on which a semiconductor laser element is arranged. The base member includes a frame surrounding the semiconductor laser element, and the semiconductor laser element is electrically connected to an electrode layer disposed on a step portion of the frame.

SUMMARY OF THE INVENTION

Japanese Unexamined Patent Application Publication No. 2019-212752 discloses a preferable structure of the base member. Such a light-emitting device may have other appropriate structure, and there is still room for improvement to extend functions or to improve convenience while reducing increase in the size of the light-emitting device.

A base member disclosed in one embodiment includes a lower portion and a lateral portion. The lower portion has an upper surface. The lateral portion surrounds the upper surface of the lower portion in a top view. The lateral portion includes a plurality of inner lateral surfaces, a first step portion, a second step portion and a third step portion. The inner lateral surfaces include a first lateral surface, a second lateral surface not adjacent to the first lateral surface, and a third lateral surface adjacent to the first lateral surface. The first step portion is arranged inward of the first lateral surface along a portion or an entirety of the first lateral surface in the top view. The first step portion has a first upper surface provided with a wiring pattern. The second step portion is arranged inward of the second lateral surface along a portion or an entirety of the second lateral surface in the top view. The second step portion has a second upper surface provided with a wiring pattern. The third step portion is arranged inward of the third lateral surface along only a portion of the third lateral surface in the top view. The third step portion has a third upper surface provided with a wiring pattern.

A light-emitting device disclosed in an embodiment includes a plurality of light-emitting elements, a base member, a plurality of wirings. The light-emitting elements include a first light-emitting element, and a second light-emitting element having a length in a first direction smaller than a length of the first light-emitting element in the first direction. The base member includes a lower portion having an upper surface on which the plurality of light-emitting elements are disposed, and a lateral portion surrounding the upper surface of the lower portion in a top view. The lateral portion includes a plurality of inner lateral surfaces, a first step portion, a second step portion, and a third step portion. The inner lateral surfaces include a first lateral surface, a second lateral surface not adjacent to the first lateral surface, and a third lateral surface adjacent to the first lateral surface, the third lateral surface extending perpendicularly to the first direction. The first step portion is arranged inward of the first lateral surface along a portion of or an entirety of the first lateral surface in the top view. The first step portion has a first upper surface provided with a first wiring pattern. The second step portion is arranged inward of the second lateral surface along a portion of or an entirety of the second lateral surface in the top view. The second step portion has a second upper surface provided with a second wiring pattern. The third step portion is arranged inward of the third lateral surface along only a portion of the third lateral surface in the top view. The third step portion has a third upper surface provided with a third wiring pattern. The wirings electrically connect the light-emitting elements to the base member. The wirings include a first wiring bonded to the first wiring pattern, a second wiring bonded to the second wiring pattern, and a third wiring bonded to the third wiring pattern.

At least one of one or more inventions disclosed according to embodiments is expected to have the effect of reduction in the size of a device.

BRIEF DESCRIPTION OF THE DRAWINGS

Figure 17:
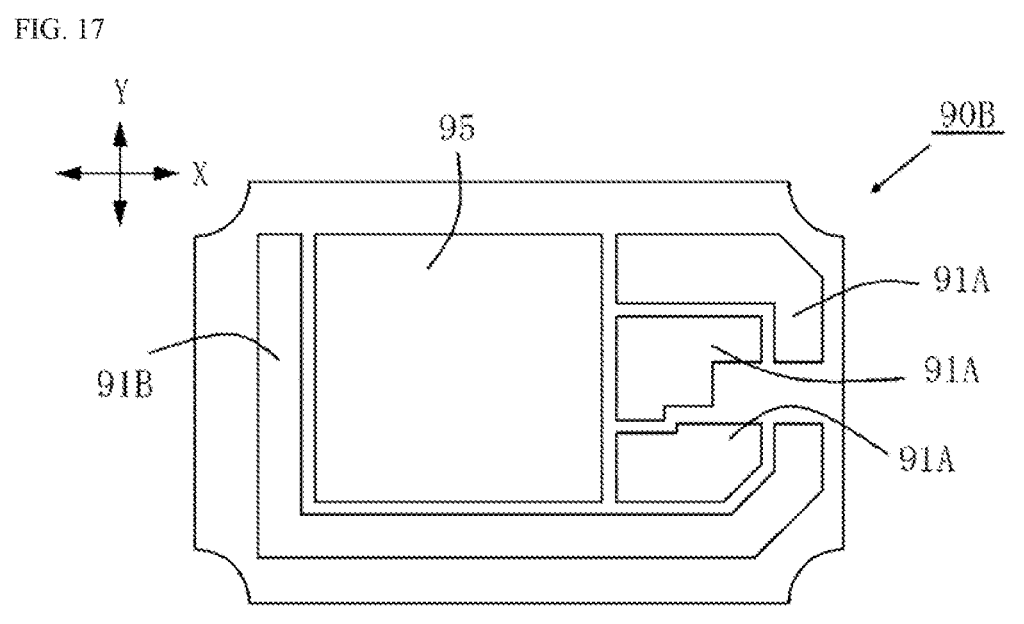

FIG. 17 is a diagram for illustrating wiring of the wiring substrate according to the fourth embodiment.

DETAILED DESCRIPTION OF EMBODIMENTS

Figure 1:
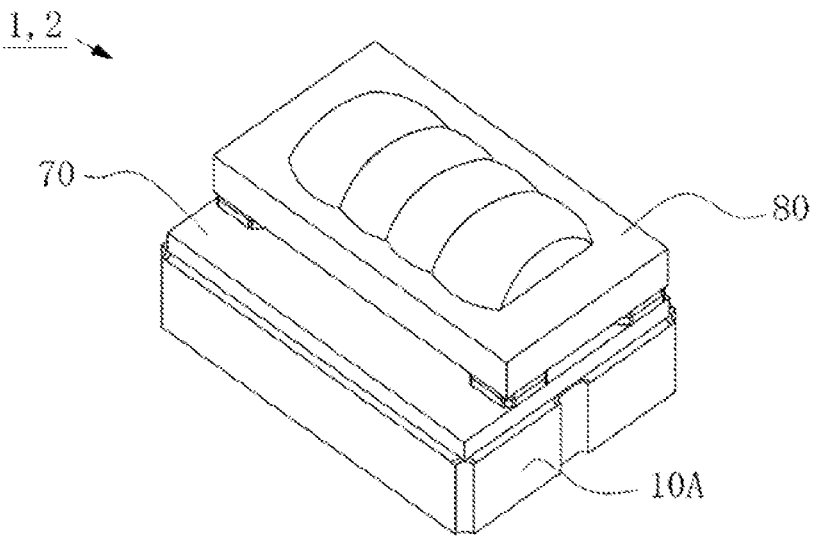
FIG. 1 is a schematic perspective view of a light-emitting device according to a first embodiment and a second embodiment.

In the present specification or the claims, as for polygonal shapes such as triangular shapes and quadrangular shapes, polygonal shapes with rounded corners, beveled corners, angled corners, reverse-rounded corners are also referred to as polygonal shapes. Likewise, not only shapes with such modification at corners (end of sides) but also shapes with modifications at intermediate portions of sides of the shapes are also referred to as polygons. That is, shapes based on polygonal shapes and partially modified are also interpreted as "polygonal shapes" in the present specification and the claims.

Such interpretation is not only polygonal shapes but also applies to terms denoting specific shapes such as trapezoids, circles, protrusions, and recesses. The same applies to sides forming such shapes. That is, even if an end or an intermediate portion of a side is modified, the modified portion is interpreted as a portion of a "side." When "polygonal shapes" and "sides" without such modified portions are intended to be distinguished from those with modifications, the term "exact" is added, such as an "exact quadrangular shape."

In the present specification or the claims, expressions such as upper/lower, right/left, front/back, front/rear, and toward/away merely indicate relative relationships such as relative positions, orientations, and directions and do not have to coincide with relationships during use.

Directions such as an X direction, a Y direction, and a Z direction in the drawings may be indicated by arrows. The directions of these arrows are consistent between a plurality of drawings showing the same embodiment.

In the present specification, for example, a term such as "member" and "portion" may be used to describe a component or the like. The term "member" indicates an object that is dealt as a physically single item. The object that is dealt as a physically single item may also be dealt as a single component in the manufacturing. Meanwhile, the term "portion" may indicate an object that does not have to be dealt as a physically single item. For example, the term "portion" may be used to indicate a portion of a single member.

The distinction between the terms "member" and "portion", and "part" described above is not intended to intentionally limit the scope of the invention in interpretation based on the doctrine of equivalents. That is, even if there is a component referred to as a "member" in the claims, such description alone does not mean that the applicant recognizes that it is essential to deal with this component as a physically single item for the application of the present invention.

In the present specification or the claims, when there are a plurality of components that are to be distinguished from each other, these components may be described using terms "first" and "second" may be used at the top of the name of the components. Also, there may be a case in which objects to be distinguished differ between the present specification and the claims. Therefore, even if a component described in the claims is indicated by the same term as that in the present specification, the object specified by the component may differ between the present specification and the claims.

For example, in the case in which components are distinguished by the ordinal numbers "first," "second," and "third" in the present specification and only the "first" and "third" components in the present specification are described in the claims, these components may be designated using the ordinal numbers "first" and "second" in the claims for clarity. In this case, the components designated using "first" and "second" in the claims indicate the "first" and "third" components in the present specification. This rule is applied not only to components but also other objects in a rational and flexible manner.

Certain embodiments of the present invention will be described below. Further, specific embodiments of the present invention will be described with reference to the accompanying drawings. Embodiments of the present invention are not limited to these specific embodiments. That is, the embodiments shown in the drawings are not the only embodiments for putting the present invention into practice. Sizes or positional relationships of members illustrated in each drawing may be exaggerated in order to facilitate understanding.

First Embodiment

Figure 2:
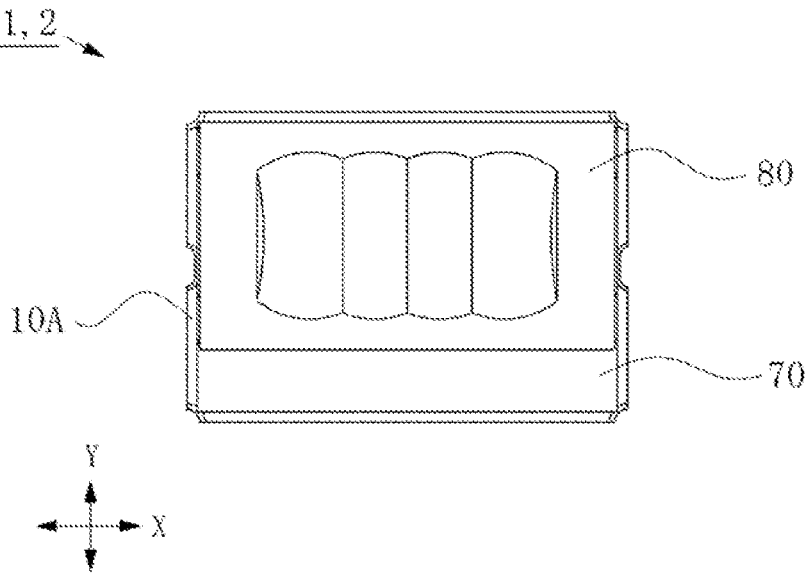
FIG. 2 is a schematic top view of the light-emitting device according to the first embodiment and the second embodiment.
Figure 3:
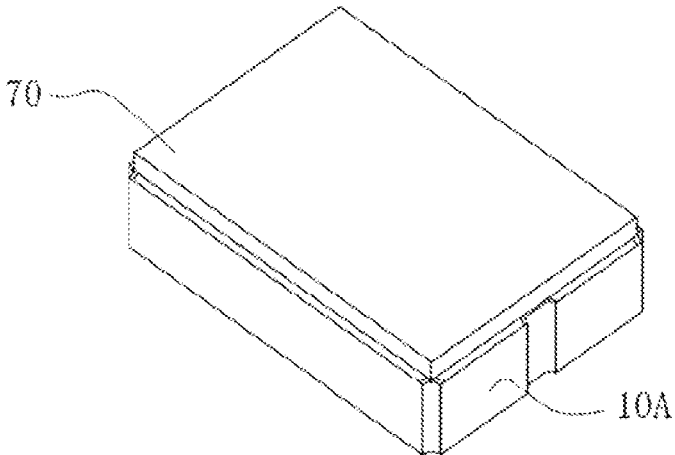
FIG. 3 is a schematic perspective view of the light-emitting device according to the first embodiment and the second embodiment before an optical member is mounted.
Figure 4:
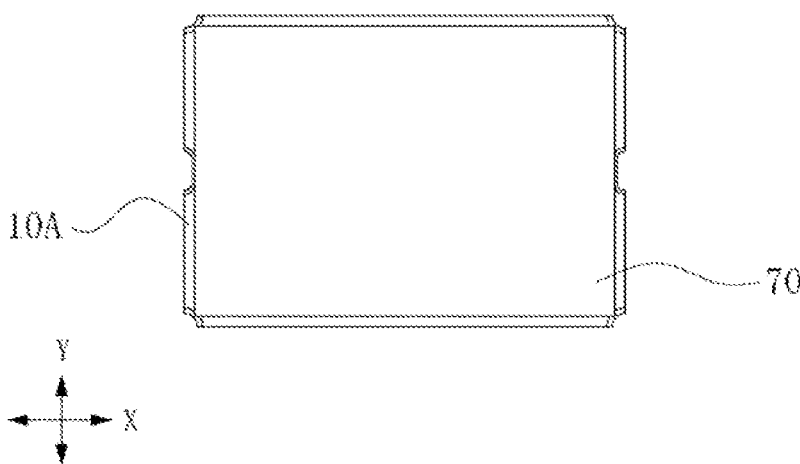
FIG. 4 is a schematic top view showing the state shown in FIG. 3.
Figure 5:
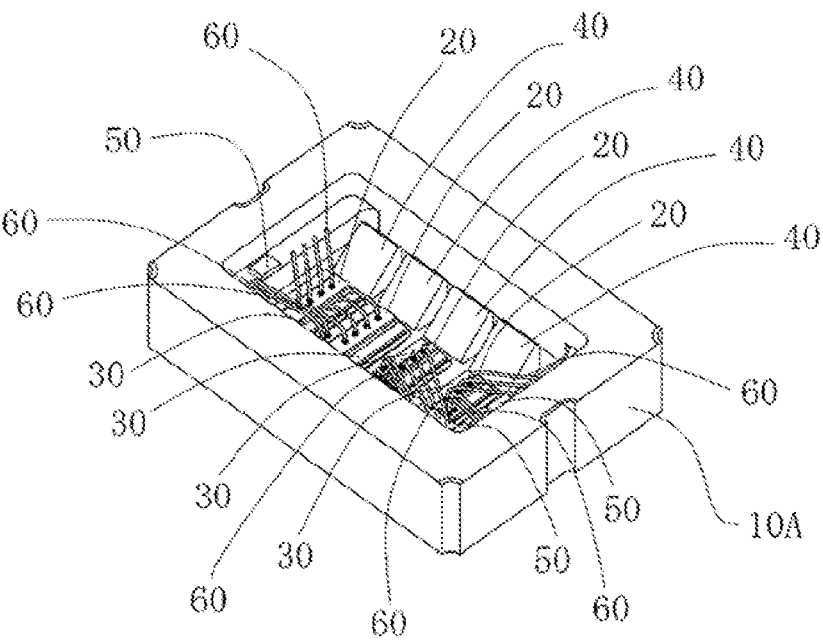
FIG. 5 is a schematic perspective view for illustrating components arranged inside the light-emitting device according to the first embodiment.
Figure 6:
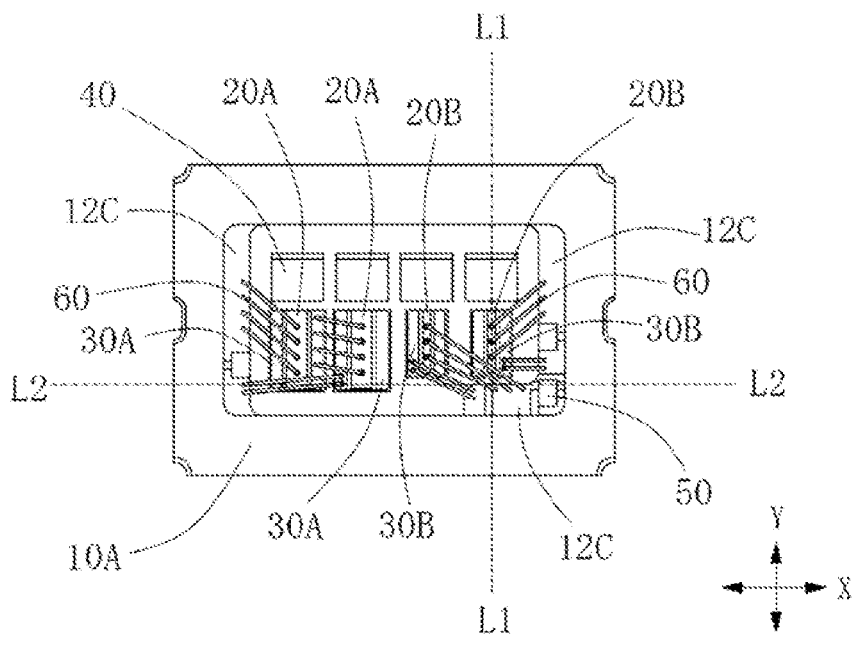
FIG. 6 is a schematic top view of the state shown in FIG. 5.
Figure 7:
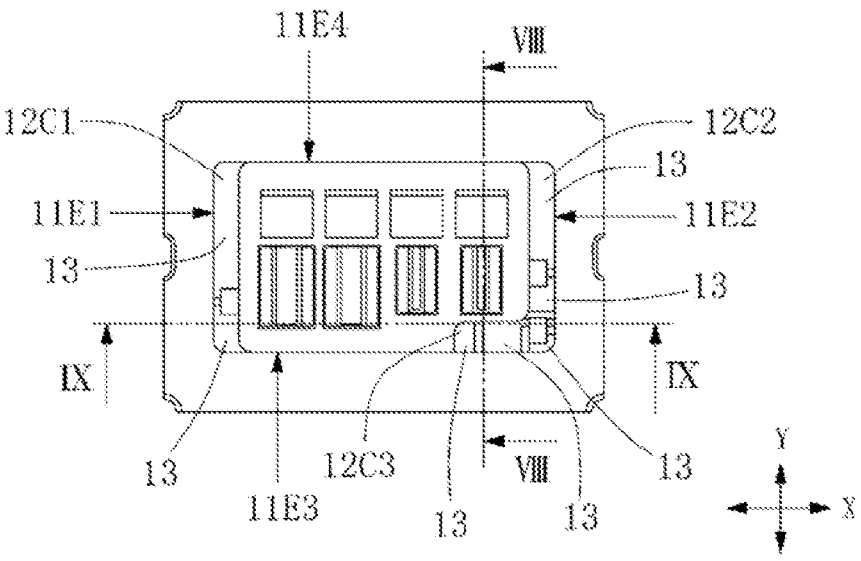
FIG. 7 is a schematic top view of the state in which wirings are removed from the state shown in FIG. 6.
Figure 8:
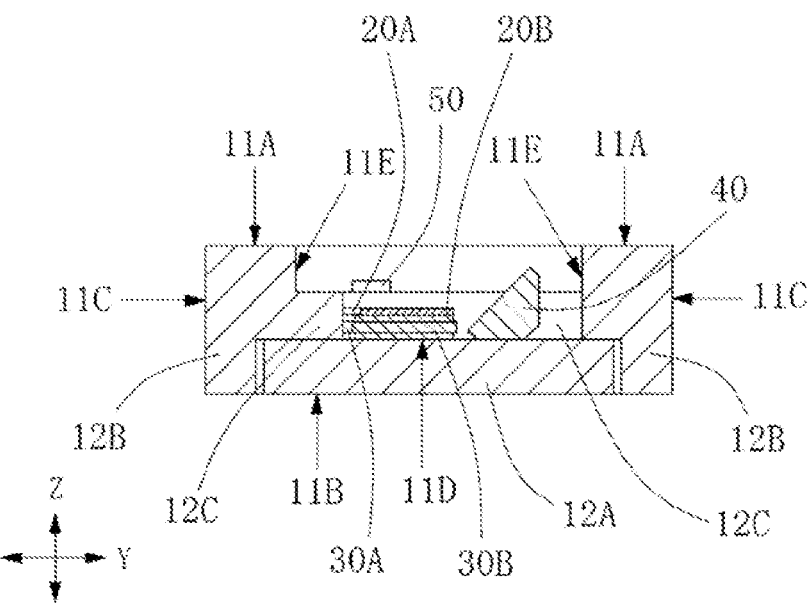
FIG. 8 is a schematic cross-sectional view taken along the cutting-plane line VIII-VIII of FIG. 7.
Figure 9:
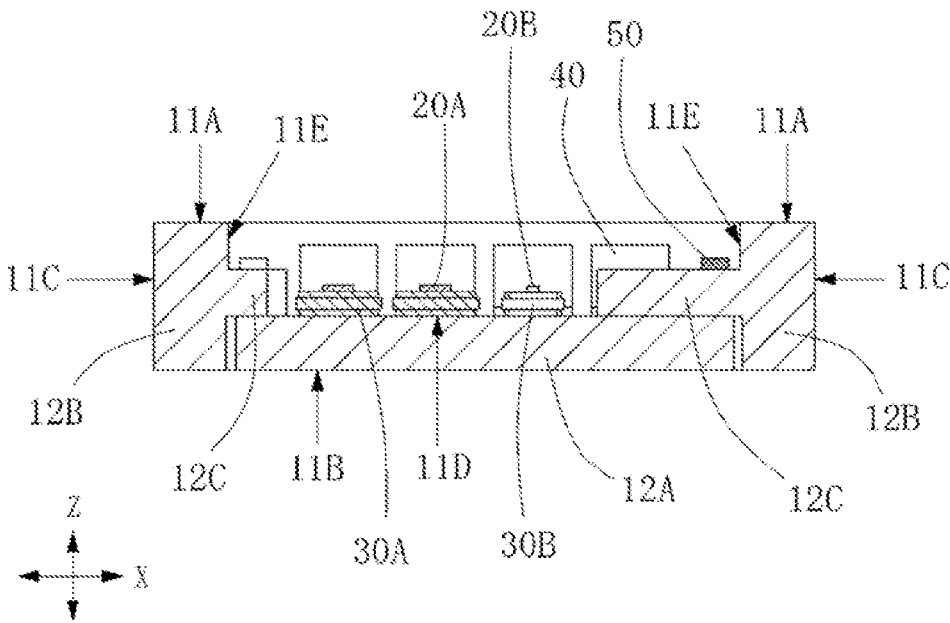
FIG. 9 is a schematic cross-sectional view taken along the cutting-plane line IX-IX of FIG. 7.

A light-emitting device 1 according to a first embodiment will be described. FIG. 1 to FIG. 9 illustrate an illustrative embodiment of the light-emitting device 1. FIG. 1 is a schematic perspective view of the light-emitting device 1. FIG. 2 is a schematic top view of the light-emitting device 1. FIG. 3 is a schematic perspective view of the light-emitting device 1 before an optical member 80 is mounted. FIG. 4 is a schematic top view of the state shown in FIG. 3. FIG. 5 is a schematic perspective view for illustrating components arranged inside the light-emitting device 1. FIG. 6 is a schematic top view in the state shown in FIG. 5. The broken lines in FIG. 6 indicate specific examples of a first virtual line and a second virtual line to be described below. FIG. 7 is a schematic top view of a state in which wirings 60 are removed from the state shown in FIG. 6. FIG. 8 is a schematic cross-sectional view taken along the cutting-plane line VIII-VIII of FIG. 7. FIG. 9 is a schematic cross-sectional view taken along the cutting-plane line IX-IX of FIG. 7.

The light-emitting device 1 includes a plurality of components. The components include a base member 10A, one or more light-emitting elements 20, one or more submounts 30, one or more reflective members 40, one or more protective elements 50, a plurality of wirings 60, a cover 70, and the optical member 80. The light-emitting device 1 can include a plurality of light-emitting elements 20 including a first light-emitting element 20A and a second light-emitting element 20B.

The light-emitting element 1 may include other components. For example, the light-emitting device 1 may further include a light-emitting element in addition to the light-emitting elements 20. The light-emitting device 1 does not necessarily include some of the components described above.

These components will be described below.

Base Member 10A

The base member 10A has an upper surface 11A, a lower surface 11B, and one or more outer lateral surfaces 11C. The outer periphery of the base member 10A has a rectangular shape in a top view. This rectangular shape can have long sides and short sides. In the base member 10A shown in the drawings, the long side direction of the rectangular shape coincides with the X direction, and the short side direction coincides with the Y direction. The outer periphery of the base member 10A does not necessarily have a rectangular shape in a top view.

The base member 10A has a depressed shape depressed from the upper surface 11A downward with respect to the upper surface 11A. The depressed shape of the base member 10A defines a recess. This recess is surrounded by the upper surface 11A in a top view.

The inner periphery of the upper surface 11A defines the outer periphery of the recess. The outer periphery of the recess has a rectangular shape in a top view. This rectangular shape can have long sides and short sides. In the base member 10A shown in the drawings, the long side direction of the rectangular shape coincides with the X direction, and the short side direction coincides with the Y direction. The outer periphery of the recess does not necessarily have a rectangular shape.

The base member 10A has a mounting surface 11D and one or more inner lateral surfaces 11E. The mounting surface 11D is located at a position below the upper surface 11A and above the lower surface 11B. One or more inner lateral surfaces 11E are located above the mounting surface 11D. One or more inner lateral surfaces 11E intersect the upper surface 11A. A plurality of surfaces defining the recess of the base member 10A include the mounting surface 11D and one or more inner lateral surfaces 11E.

One or more inner lateral surfaces 11E are perpendicular to the mounting surface 11D. As used herein, the term "perpendicular" can include a deviation of ±3°. The inner lateral surfaces 11E is not necessarily perpendicular to the mounting surface 11D.

The base member 10A includes a lower portion 12A and a lateral portion 12B. The lower portion 12A has the lower surface 11B. The lateral portion 12B has the upper surface 11A and one or more outer lateral surfaces 11C. The lower portion 12A has the mounting surface 11D. The lateral portion 12B has one or more inner lateral surfaces 11E. In the example of the base member 10A shown in the drawings, the lateral portion 12B further has a lower surface, and the base member 10A has the lower surface 11B of the lower portion 12A and the lower surface of the lateral portion 12B.

The lateral portion 12B surrounds the mounting surface 11D. The mounting surface 11D is surrounded by the lateral portion 12B in a top view. The mounting surface 11D can also be referred to as the upper surface of the lower portion 12A.

The base member 10A has one or more step portions 12C. Each of the step portions 12C has an upper surface and an inner lateral surface intersecting the upper surface and extending downward from the upper surface. The upper surfaces of the step portions 12C intersect the inner lateral surfaces 11E. The inner lateral surfaces of the step portions 12C intersect the mounting surface 11D.

The one or more step portions 12C are included in the lateral portion 12B. Each of one or more the step portions 12C is formed along a portion or the entirety of a corresponding lateral surface 11E in a top view. The one or more step portions 12C are formed inward of the upper surface 11A in a top view. The one or more step portions 12C are formed inward of the one or more inner lateral surfaces 11E in a top view.

The base member 10A can include a plurality of step portions 12C. The step portions 12C include a step portion 12C formed along a portion or the entirety of a corresponding inner lateral surface 11E in a top view. The step portions 12C can include a step portion 12C formed along only a portion of a corresponding inner lateral surface 11E in a top view. The step portions 12C can include a step portion 12C formed along the entirety of a corresponding inner lateral surface 11E in a top view.

The step portions 12C include a step portion 12C formed along a portion or an entirety of a certain inner lateral surface 11E and a step portion 12C formed along only a portion of another inner lateral surface 11E in atop view. When having an additional step portion 12C, the additional step portion 12C can lie along a portion of an inner lateral surface 11E, which allows the rest portion to be used as the mounting surface 11D. With such a base portion 10A, the device can be reduced in the size.

The step portions 12C include two step portions 12C integrally formed along respective ones of adjacent inner lateral surfaces 11E. In this structure, one of the two step portions 12C that is formed along one of the adjacent inner lateral surfaces 11E is continuous with the other of the two step portions 12C that is formed along the other of the adjacent inner lateral surfaces 11E in a top view. The upper surfaces of the two step portions 12C can be located in the same plane. Such two step portions 12C integral with each other can be easily manufactured.

The step portions 12C can include a step portion 12C formed along an entirety of a certain inner lateral surface 11E and a step portion 12C formed along only a portion of another inner lateral surface 11E longer than the certain inner lateral surface 11E in a top view.

The step portions 12C include a step portion 12C formed along an inner lateral surface 11E to have a length of 10% or more and 75% or less of the length of the inner lateral surface 11E in a direction parallel to the upper surface of the lower portion 12A. In addition to such a step portion 12C, the step portions 12C include a step portion 12C formed along an inner lateral surface 11E to have a length of 30% or more and 100% or less of the length of the inner lateral surface 11E in a direction parallel to the upper surface of the lower portion 12A.

One or more wiring patterns 13 are disposed on the upper surfaces of the step portions 12C. The wiring pattern 13 is electrically connected to another wiring pattern disposed on the lateral portion 12B via a wiring passing through the lateral portion 12B. The wiring patterns 13 is electrically connected to a wiring pattern disposed on the lower surface of the lateral portion 12B. Each of the wiring patterns 13 can be electrically connected to a wiring pattern disposed on the upper surface 11A or the outer lateral surfaces 11C of the lateral portion 12B.

A plurality of wiring patterns 13 are disposed on the upper surface[s] of the one or more step portions 12C. One or more wiring patterns 13 of the plurality of wiring patterns 13 can be disposed on each of the step portions 12C. The base member 10A can include a step portion 12C having an upper surface on which a plurality of wiring patterns 13 are disposed.

Disposing the wiring pattern 13 on the upper surfaces of the step portion 12C allows the wirings to be connected above the mounting surface 11D. This structure may facilitate bonding of wirings.

A main material of the lower portion 12A and a main material of the lateral portion 12B of the base member 10A can be different from each other. The base member 10A can be formed by bonding a member constituting the lower portion 12A and a member constituting the lateral portion 12B. In the base member 10A shown in the drawings, the lower portion 12A constituted of a member having a flat plate shape and the lateral portion 12B constituted of a member having a frame shape are bonded together.

The term "main material" as used herein refers to a material constituting the largest proportion of an article to be obtained by weight or volume. In the case in which an article to be obtained is formed of a single material, that material serves as the main material. That is, the expression that a certain material is a main material includes the case in which the proportion of the material can be 100%.

The base member 10A can contain a ceramic as the main material for the lateral portion 12B and a metal or a composite containing a metal as the main material for the lower portion 12A. The base member 10A can be formed by bonding the lower portion 12A and the lateral portion 12B. A base member 10A in which the lower portion 12A and the lateral portion 12B are integrally formed can be employed. In this case, for example, the base member 10A can be formed using a ceramic as the main material.

Examples of the ceramic include aluminum nitride, silicon nitride, aluminum oxide, and silicon carbide. Examples of the metal include copper, aluminum, and iron. Alternatively, copper-molybdenum, a copper-diamond composite material, copper-tungsten, or the like can be used as the composite containing a metal.

By forming the lower portion 12A separately from the lateral portion 12B, the lower portion 12A can have different characteristics from the characteristics of the lateral portion 12B. For example, a metal having a heat dissipation performance (having higher thermal conductivity) higher than that of the ceramic employed for the lateral portion 12B can be employed for the lower portion 12A, which allows for facilitating dissipation of heat generated from components mounted on the mounting surface 11D. Disposing the wiring pattern 13 on the step portion 12C of the lateral portion 12B allows for securing a region for wiring connections while the lower portion 12A is formed of an electroconductive material such as a metal plate.

The base member 10A shown in the drawings has a plurality of inner lateral surfaces 11E including a certain inner lateral surface 11E (hereinafter referred to as a first lateral surface), an inner lateral surface 11E (hereinafter referred to as a second lateral surface) not adjacent to the first lateral surface, and an inner lateral surface 11E (hereinafter referred to as a third lateral surface) adjacent to the first lateral surface. The first lateral surface and the second lateral surface face each other. The third lateral surface is also adjacent to the second lateral surface. The base member 10A further has an inner lateral surface 11E (hereinafter referred to as a fourth lateral surface) that is adjacent to the first lateral surface and the second lateral surface and faces the third lateral surface. For example, surfaces 11E1, 11E2, 11E3, and 11E4 in FIG. 7 can be respectively regarded as the first lateral surface, the second lateral surface, the third lateral surface, and the fourth lateral surface.

The base member 10A shown in the drawings includes a step portion 12C (hereinafter referred to as a first step portion) formed inward of a plurality of inner lateral surfaces 11E along a portion or the entirety of the first lateral surface in a top view, a step portion 12C (hereinafter referred to as a second step portion) formed inward of a plurality of inner lateral surfaces 11E along a portion or the entirety of the second lateral surface in a top view, and a step portion 12C (hereinafter referred to as a third step portion) formed inward of a plurality of inner lateral surfaces 11E along only a portion of the third lateral surface in a top view. For example, portions 12C1, 12C2, and 12C3 in FIG. 7 can be respectively regarded as the first step portion, the second step portion, and the third step portion.

In the base member 10A shown in the drawings, the first lateral surface and the second lateral surface face each other. The third lateral surface and the fourth lateral surface face each other. The first lateral surface and the second lateral surface extend in the Y direction, and the third lateral surface and the fourth lateral surface extend in the X direction in a top view. The direction perpendicular to the first lateral surface in atop view is the X direction. The direction perpendicular to the second lateral surface in atop view is the X direction. The direction perpendicular to the third lateral surface in a top view is the Y direction. The direction perpendicular to the fourth lateral surface in a top view is the Y direction.

In the base member 10A shown in the drawings, a line along which the first lateral surface and the first step portion meet is parallel to the Y direction. A line along which the first lateral surface of the first step portion and the mounting surface 11D meet is parallel to the Y direction. A line along which the second lateral surface and the second step portion meet is parallel to the Y direction. A line along which of the second step portion and the mounting surface 11D meet is parallel to the Y direction.

In the base member 10A shown in the drawings, the line of intersection of the third lateral surface and the third step portion is parallel to the X direction. The line of intersection of the third step portion and the mounting surface 11D is parallel to the X direction. The line of intersection of the third lateral surface and the mounting surface 11D is parallel to the X direction. The line of intersection of the fourth lateral surface and the mounting surface 11D is parallel to the X direction.

In the base member 10A shown in the drawings, the second step portion and the third step portion are integrally formed. The second step portion formed along the second lateral surface is connected to the third step portion formed along the third lateral surface in a top view. The upper surfaces of the two step portions 12C are located in the same plane.

In the base member 10A shown in the drawings, one or more wiring patterns 13 (hereinafter referred to as first wiring pattern[s]) are disposed on the upper surface (hereinafter referred to as a first upper surface) of the first step portion. One or more wiring patterns 13 (hereinafter referred to as second wiring pattern[s]) are disposed on the upper surface (hereinafter referred to as a second upper surface) of the second step portion. One or more wiring patterns 13 (hereinafter referred to as third wiring pattern[s]) are disposed on the upper surface (hereinafter referred to as a third upper surface) of the third step portion.

In the base member 10A shown in the drawings, the third step portion is formed along the third lateral surface to have a length of 10% or more and 75% or less of the length of the third lateral surface in a direction parallel to the upper surface of the lower portion 12A. The length of the third step portion along the third lateral surface is 10% or more and 75% or less of the length of the second step portion along the second lateral surface in a top view. In the case in which the third step portion partially formed is located within a required region, the base member 10A can have a structure in which the third step portion is shorter than the second step portion.

In the base member 10A shown in the drawings, the third lateral surface is longer than the second lateral surface in a direction parallel to the upper surface of the lower portion 12A. The length of the second lateral surface is 20% or more and 90% or less of the length of the third lateral surface. The first step portion is formed along the entirety first lateral surface. The second step portion is formed along the entirety second lateral surface. When the step portion along the longer inner lateral surface is partially formed, a region that contributes to the reduction in size is easily secured.

Light-Emitting Element 20

The light-emitting element 20 has a light emission surface from which light is emitted. The light-emitting element 20 has an upper surface, a lower surface, and a plurality of lateral surfaces. One or more of the upper surface, the lower surface, and the lateral surfaces of the light-emitting element 20 may serve as the light emission surface. The light-emitting element 20 may have one or more light emission surfaces.

The upper surface of the light-emitting element 20 has a rectangular shape having long sides and short sides. The upper surface of the light-emitting element 20 does not necessarily have a rectangular shape. A semiconductor laser element can be employed for the light-emitting element 20. Other than a semiconductor laser element, a light-emitting diode or the like may be employed for the light-emitting element 20.

For example, a light-emitting element configured to emit blue light, a light-emitting element configured to emit green light, or a light-emitting element configured to emit red light can be employed for the light-emitting element 20. A light-emitting element configured to emit light having another color may be employed for the light-emitting element 20.

Blue light herein refers to light with a peak emission wavelength in a range of 420 nm to 494 nm. Green light refers to light with a peak emission wavelength in a range of 495 nm to 570 nm. Red light refers to light with a peak emission wavelength in a range of 605 nm to 750 nm.

A semiconductor laser element, which is an example of the light-emitting element 20 will be described. In atop view, the semiconductor laser element has a rectangular outer shape having one pair of opposite sides serving as long sides and another pair of opposite sides serving as short sides. Light (laser light) emitted from the semiconductor laser element has divergence. Divergent light is emitted from the emission end surface of the semiconductor laser element. The emission end surface of the semiconductor laser element can be referred to as the light emission surface of the light-emitting element 20.

Light emitted from the semiconductor laser element forms an elliptic far-field pattern (hereinafter referred to as an "FFP") in a plane parallel to the emission end surface of the light. The FFP is the shape or the light intensity distribution of the emitted light at a position away from the emission end surface.

A light passing through the center of the elliptic shape of FFP, in other words, a light having a peak intensity of the light intensity distribution of the FFP, is referred to as a light traveling on an optical axis or a light beam passing through an optical axis. A light having an intensity of $1/e^2$ or greater of the peak intensity in the light intensity distribution of the FFP is referred to as a main portion of light.

The FFP of light emitted from the semiconductor laser element has an elliptic shape that is longer in a layering direction than in a direction perpendicular to the layering direction in a plane parallel to the emission end surface of the light. The layering direction is a direction in which a plurality of semiconductor layers including an active layer are layered in the semiconductor laser element. The direction perpendicular to the layering direction can also be referred to as the in-plane direction of the semiconductor layers. The major axis direction and the minor axis direction of the elliptic shape of FFP can also be referred to as a fast axis direction and a slow axis direction of the semiconductor laser element, respectively.

The angle at which the light beam with a light intensity of $1/e^2$ of the peak light intensity based on the light intensity distribution of the FFP diverges is referred to as the divergence angle of light from the semiconductor laser element. The divergence angle of light may be determined from, for example, the half value of the peak light intensity instead of a light intensity of $1/e^2$ of the peak light intensity. In the description in the present specification, an angle simply referred to as a "divergence angle of light" indicates a divergence angle of light at a light intensity of $1/e^2$ of the peak light intensity. The divergence angle in the fast axis direction is greater than the divergence angle in the slow axis direction.

Examples of the semiconductor laser element configured to emit blue light or the semiconductor laser element configured to emit green light include a semiconductor laser element including a nitride semiconductor. Examples of the nitride semiconductor include GaN, InGaN, and AlGaN. Examples of the semiconductor laser element configured to emit red light include elements including an InAlGaP, GaInP, GaAs, or AlGaAs semiconductor.

Submount 30

The submount 30 has two bonding surfaces and is formed into a rectangular parallelepiped shape. The upper surface of the submount 30 has a rectangular shape. The upper surface of the submount 30 can have a rectangular shape having short sides and long sides.

The submount 30 has one bonding surface opposite to the other bonding surface. The distance between the two bonding surfaces is smaller than the distance between other two surfaces opposite to each other. The shape of the submount 30 is not limited to the rectangular parallelepiped shape. For example, the submount 30 can be formed of silicon nitride, aluminum nitride, or silicon carbide. Metal films used for bonding are disposed on the bonding surfaces.

Reflective Member 40

The reflective members 40 has a light-reflective surface. The light-reflective surface is inclined with respect to a lower surface of the reflective member 40. That is, the light-reflective surface is not in a perpendicular or parallel relationship with the lower surface. A straight line connecting the lower and upper ends of the light-reflective surface is inclined with respect to the lower surface of the reflective member 40. The angle between the lower surface and the light-reflective surface, or the angle between the lower surface and the straight line connecting the lower and upper ends of the light-reflective surface, is referred to as the inclination angle of the light-reflective surface.

In the reflective member 40 shown in the drawings, the light-reflective surface is a flat surface and forms an inclination angle of 45° with the lower surface of the reflective member 40. The light-reflective surface is not necessarily a flat surface but may be, for example, a curved surface. The inclination angle of the light-reflective surface is not necessarily 45°.

For the main material of the reflective member 40, glass, metal, or the like can be used. The main material is preferably a material resistant to heat, such as quartz, glass such as BK7 (borosilicate glass), or a metal such as aluminum. The reflective member 40 may be formed of Si as a main material. When the main material is a reflective material, the main material can constitute the light-reflective surface. In the case in which the light-reflective surface is formed separately from the main material, the light-reflective surface can be formed of, for example, a metal such as Ag and Al or a dielectric multilayer film such as $Ta_2O_5/SiO_2$, $TiO_2/SiO_2$, or $Nb_2O_5/SiO_2$.

The reflectance at the peak wavelength of light applied to the light-reflective surface is 90% or greater. The reflectance may be 95% or greater. The reflectance may be 99% or greater. The light reflectance is 100% or less or less than 100%.

Protective Element 50

The protective element 50 are used to prevent excessive current from flowing through and breaking specific element (such as the light-emitting element 20). Example of the protective element 50 includes a Zener diode. The Zener diode formed of Si can be employed.

Wiring 60

The wiring 60 is made of an electroconductive material and has a linear shape having bonding portions at its two opposite ends. The bonding portions at two opposite ends are bonded to other components. The wiring 60 is, for example, a metal wire. For example, gold, aluminum, silver, or copper can be used as the metal.

Cover 70

The cover 70 has a lower surface and an upper surface and is formed into a rectangular parallelepiped flat plate. The cover 70 may have a shape other than a rectangular parallelepiped shape. The cover 70 is light-transmissive. The term "light-transmissive" as used herein indicates that the transmittance to light is 80% or more. The transmittance is not necessarily 80% or more at all wavelengths. The cover 70 may partially have a non-light-transmissive region (region that is not light-transmissive).

The cover 70 is formed of glass as the main material. The main material constituting the cover 70 is a highly light-transmissive material. The main material of the cover 70 is not limited to glass but may be, for example, sapphire.

Optical Member 80

The optical member 80 has an upper surface, a lower surface, and a lateral surface. The optical member 80 has an optical effect such as reflection, transmission and refraction or optical action such as condensing, diffusion, and collimation on incident light.

The optical member 80 can have one or more lens surfaces. One or more lens surfaces are located on the upper surface side of the optical member 80. The one or more lens surfaces may be located on the lower surface side of the optical member 80. The upper surface and the lower surface are flat surfaces. One or more lens surfaces meet the upper surface. One or more lens surfaces are surrounded by the upper surface in a top view. The optical member 80 has a rectangular outer shape in a top view. The lower surface of the optical member 80 is rectangular.

A portion of the optical member 80 overlapping with one or more lens surfaces in a top view is referred to as a lens portion. A portion of the optical member 80 overlapping with the upper surface in a top view is referred to as a non-lens portion. A portion on the lens surface side of the lens portion divided into two portions by a virtual plane including the upper surface is referred to as a lens-shaped portion, and a portion on the lower surface side is referred to as a flat plate-shaped portion. The lower surface of the lens portion is a portion of the lower surface of the optical member 80. The lower surface of the optical member 80 is constituted of the lower surface of the lens portion and the lower surface of the non-lens portion.

The optical member 80 shown in the drawings has a plurality of lens surfaces. The lens surfaces are continuously formed in one direction. The optical member 80 has four lens surfaces, and vertices of the four lens surfaces are aligned on a single straight line.

A direction in which a plurality of lens surfaces are aligned in a top view is referred to as a connection direction. The lens surfaces are longer in the connection direction than in the direction perpendicular to this direction in a top view. As for the optical member 80 shown in the drawings, the connection direction coincides with the X direction.

The optical member 80 is highly light-transmissive. The optical member 80 is highly light-transmissive in both the lens portion and the non-lens portion. The optical member 80 is highly light-transmissive as a whole. For example, the optical member 80 can be formed of glass such as BK7.

Light-Emitting Device 1

Subsequently, the light-emitting device 1 including the components described above will be described.

In the light-emitting device 1, one or more light-emitting elements 20 are disposed on the mounting surface 11D. One or more light-emitting elements 20 are disposed such that respective light emission surfaces face in a lateral direction. One or more light-emitting elements 20 are disposed such that respective light emission surfaces face an inner lateral surface 11E of the package.

The light-emitting element 20 is oriented such that its length is greater in a first direction than in a second direction perpendicular to the first direction in a top view. One or more light-emitting elements 20 can be oriented such that respective length in the first direction is twice or more as great as the length in the second direction. In the light-emitting device 1 shown in the drawings, the first direction coincides with the Y direction, and the second direction coincides with the X direction.

Each of the one or more light-emitting elements 20 preferably has a length in the first direction that is 30% or more and 70% or less of the length of the mounting surface 11D in the first direction in a top view. With the base member 10A having such a length, the light-emitting device 1 can be reduced in the size.

In relation to the step portion 12C formed along only a portion of an inner lateral surface 11E in a top view, the one or more light-emitting elements 20 include a light-emitting element 20 disposed across a virtual straight line (hereinafter referred to as a first virtual line) perpendicular to this inner lateral surface 11E and passing through the step portion 12C in a top view. When a virtual straight line that is parallel to the inner lateral surface 11E and that passes through a point on this step portion 12C (the third step portion) farthest from this inner lateral surface 11E in a direction perpendicular to the inner lateral surface 11E and is referred to as a second virtual line, the shortest distance between the second virtual line and the light-emitting element 20 is 50 μm or greater. The shortest distance is preferably less than 400 μm. With the shortest distance being 50 μm or greater, the light-emitting element 20 can be easily mounted. With the shortest distance being less than 400 μm, the light-emitting device 1 can be reduced in the size. When the virtual straight line passes through the light-emitting element 20, the shortest distance is zero. For example, on the basis of FIG. 6, the first virtual line and the second virtual line can be respectively denoted by L1 and L2.

In relation to a step portion 12C formed along only a portion of an inner lateral surface 11E in a top view, one or more light-emitting elements 20 include a light-emitting element 20 not disposed across the first virtual line. The shortest distance from this inner lateral surface 11E to this light-emitting element 20 is 50 μm or greater. With the shortest distance being 50 μm or greater, the light-emitting element 20 can be easily mounted.

In relation to a step portion 12C formed on an inner lateral surface 11E adjacent to the inner lateral surface 11E along which the step portion 12C is partially formed, one or more light-emitting elements 20 are disposed across a virtual straight line perpendicular to the adjacent inner lateral surface 11E and passing through the step portion 12C in a top view.

The light-emitting device 1 can include a plurality of light-emitting elements 20. The light-emitting elements 20 include the first light-emitting element 20A and the second light-emitting element 20B shorter than the first light-emitting element 20A in the first direction. The light-emitting elements 20 include one or more first light-emitting elements 20A and one or more second light-emitting elements 20B. The light-emitting elements 20 can include a plurality of first light-emitting elements 20A. The light-emitting elements 20 can include a plurality of second light-emitting elements 20B. The light-emitting device 1 shown in the drawings includes two first light-emitting elements 20A and two second light-emitting elements 20B.

Light-emitting elements 20 that emit first light having a peak at a first wavelength are employed for the first light-emitting elements 20A. Light-emitting elements 20 that emit second light having a peak at a second wavelength different from the first wavelength can be employed for the second light-emitting elements 20B.

For example, the first light-emitting elements 20A can be light-emitting elements 20 that emit red light, and the second light-emitting elements 20B can be light-emitting elements 20 that emit blue light. Alternatively, the first light-emitting elements 20A can be light-emitting elements 20 that emit red light, and the second light-emitting elements 20B can be light-emitting elements 20 that emit green light.

The light-emitting elements 20 may include a plurality of first light-emitting elements 20A that emit light with different peak wavelengths. The light-emitting elements 20 may include a plurality of second light-emitting elements 20B that emit light with different peak wavelengths.

For example, the light-emitting device 1 can include a first light-emitting element 20A that emits red light and a first light-emitting element 20A that emits infrared light. Alternatively, the light-emitting device 1 can include a second light-emitting element 20B that emits blue light and a second light-emitting element 20B that emits green light.

The plurality of light-emitting elements 20 may include a plurality of first light-emitting elements 20A that have lengths in the first direction different from each other. The plurality of light-emitting elements 20 may include a plurality of first light-emitting elements 20A that have lengths in the second direction different from each other. The plurality of light-emitting elements 20 may include a plurality of second light-emitting elements 20B that have lengths in the first direction different from each other. The plurality of light-emitting elements 20 may include a plurality of second light-emitting elements 20B that have lengths in the second direction different from each other.

For example, the plurality of light-emitting elements 20 may include a light-emitting element 20 configured to emit red light, a light-emitting element 20 configured to emit blue light, a light-emitting element 20 configured to emit green light, and lengths of the light-emitting elements 20 in the first direction or in the second direction may be different among emission colors The light-emitting device 1 includes a first light-emitting element 20A disposed offset from the first virtual line. The light-emitting device 1 includes a second light-emitting element 20B disposed across the first virtual line. The first light-emitting element 20A included in the light-emitting device 1 is disposed offset from the first virtual line. The light-emitting device 1 can include a second light-emitting element 20B disposed offset from the first virtual line.

The step portion 12C partially formed on the inner lateral surface 11E is formed closer to the second light-emitting element 20B than the first light-emitting element 20A. The shortest distance from the second virtual line to the first light-emitting element 20A is shorter than the shortest distance from the second virtual line to the second light-emitting element 20B. With such an arrangement of the light-emitting elements 20, the light-emitting device 1 can be reduced in the size.

In the light-emitting device 1 shown in the drawings, there is no virtual straight line that is perpendicular to the third lateral surface and passes through the third step portion and the first light-emitting element 20A in a top view. The first light-emitting element 20A is disposed at positions that satisfy this condition. With such an arrangement, light-emitting element 20 longer in the first direction can be disposed in a mounting region longer in the first direction, which can allow for reduction in the size of the light-emitting device 1.

In the light-emitting device 1 shown in the drawings, there is a virtual straight line that is perpendicular to the third lateral surface and passes through the third step portion and the second light-emitting element 20B in a top view. The second light-emitting element 20B is disposed at positions that satisfy this condition. With such an arrangement, light-emitting element 20 shorter in the first direction can be disposed in a mounting region shorter in the first direction due to the third step portion, which can allow for the reduction in the size of the light-emitting device 1.

The light-emitting elements 20 are aligned such that the respective light emission surfaces face in the same direction. The same direction herein includes the case in which a rotational misalignment between the light emission surfaces of adjacent light-emitting elements 20 in a plane parallel to the mounting surface 11D is in ±5°. In the light-emitting device 1 shown in the drawings, the light-emitting elements 20 are aligned in the X direction.

The distance from the light emission surfaces of the light-emitting elements 20 to a plane parallel to the light emission surface of a certain light-emitting element 20 is 0 μm or greater and 200 μm or less. The optical axes of a plurality of light beams emitted from the light-emitting elements 20 are parallel to each other. The light emission surfaces of the light-emitting elements 20 can be located in a single plane. That is, the light-emitting elements 20 can be disposed with the light emission surfaces aligned.

In the light-emitting device 1 shown in the drawings, light with an FFP in which the fast axis direction is perpendicular to the mounting surface 11D is emitted from the light emission surface of each light-emitting element 20, which is a semiconductor laser element. As for any light-emitting element 20, the divergence angle in the slow axis direction is 200 or less. The divergence angle is greater than 0°.

In the light-emitting device 1, one or more light-emitting elements 20 are mounted on one or more submounts 30. One bonding surface of each submount 30 bonds the light-emitting element 20, and the other bonding surface is bonded to the mounting surface 11D. The light-emitting elements 20 are disposed on the mounting surface 11D with the respective submounts 30 therebetween. The light-emitting elements 20 may be disposed on the mounting surface 11D without the submounts 30.

The length of a submount 30 in the first direction is greater than the length of the light-emitting element 20 mounted on the submount 30 in the first direction. The length of the submount 30 in the second direction is greater than the length of the light-emitting element 20 mounted on the submount 30 in the second direction. This structure allows for increasing the heat dissipation effect of the submounts 30 for heat generated from the light-emitting elements 20. Also, region to which other component such as the wiring 60 is bonded can be secured on the upper surface of the submount 30 exposed from the light-emitting element 20.

The difference in length between the submount 30 and the light-emitting element 20 in the first direction is smaller than the difference in length between the submount 30 and the light-emitting element 20 in the second direction. By exposing a greater area of the upper surfaces of the submounts 30 in the second direction, the heat dissipation effect of a plurality of light-emitting elements 20 aligned in the second direction can be increased.

The submounts 30 are in a one-to-one correspondence with the light-emitting elements 20. The number of the submounts 30 included in the light-emitting device 1 is equal to the number of the light-emitting elements 20. A plurality of light-emitting elements 20 may be disposed on a single submount 30.

The light-emitting device 1 can include a plurality of submounts 30 corresponding to a plurality of light-emitting elements 20. The submounts 30 include a first submount 30A and a second submount 30B shorter than the first submount 30A in the first direction. The first light-emitting element 20A is mounted on the first submount 30A. The second light-emitting element 20B is mounted on the second submount 30B. The first submount 30A is disposed across the second virtual line in a top view. By providing a plurality of submounts 30 corresponding to the lengths of a plurality of light-emitting elements 20 having different lengths in the first direction, the light-emitting device 1 can be reduced in the size.

The light-emitting device 1 includes a first submount 30A disposed offset from the first virtual line. The light-emitting device 1 includes a second submount 30B disposed across the first virtual line. The first submount 30A included in the light-emitting device 1 is not disposed across the first virtual line. The light-emitting device 1 can include a second submount 30B disposed offset from the first virtual line.

In the first direction, the first submount 30A is longer than the second submount 30B by 100 μm or greater and 600 μm or less. The difference in length between the second submount 30B disposed across the first virtual line and the step portion 12C located across the first virtual line in the first direction is preferably smaller than the difference in length between the second submount 30B and the first submount 30A in the first direction. This structure can allow for the reduction in the size of the light-emitting device 1.

In the light-emitting device 1 shown in the drawings, the difference between the length of the first submount 30A in the first direction and the length of the second submount 30B in the first direction is smaller than the length of the third step portion in the first direction. The difference between the length of the first submount 30A in the first direction and the length of the second submount 30B in the first direction is preferably 30% or more and 90% or less of the length of the third step portion in the first direction. This structure may enhance the effect of the step portion 12C that is partially formed.

In the light-emitting device 1, one or more reflective members 40 are disposed in a space inside the package. One or more reflective members 40 are disposed on the mounting surface 11D. One or more reflective members 40 have one or more light-reflective surfaces. Light emitted from one or more light-emitting elements 20 is reflected by one or more light-reflective surfaces. The light-reflective surfaces are inclined with respect to the direction of travel of light passing through the optical axis at an angle of 45°. The light reflected by the light-reflective surface travels upward. One or more light-reflective surfaces are irradiated with the main portions of a plurality of light beams.

The reflective members 40 can be in a one-to-one correspondence with the light-emitting elements 20. That is, the same number of the reflective members 40 as the number of the light-emitting elements 20 are disposed. All the reflective members 40 have the same size and shape. The light-reflective surface of a single reflective member 40 is irradiated with the main portion of a light beam emitted from a single light-emitting element 20. The light-reflective surface of a single reflective member 40 may be irradiated with the main portions of light beams emitted from a plurality of light-emitting elements 20.

The light-reflective surfaces of the reflective members 40 reflect 90% or more of the main portions of incident light beams. The light-emitting device 1 does not necessarily include the reflective members 40. In this case, for example, the light emission surfaces of the light-emitting elements 20 face the upper surface.

The light-emitting device 1 can include a plurality of reflective members 40. A plurality of reflective members 40 are aligned in the same direction as the direction of alignment of a plurality of light-emitting elements 20 in a top view. The optical axes of a plurality of light beams reflected by one or more light-reflective surfaces are parallel to each other.

In the light-emitting device 1, one or more protective elements 50 are disposed on the base member 10A. One or more protective elements 50 are disposed on the wiring patterns 13 or may be disposed at positions other than the wiring patterns 13, such as on the submounts 30. One or more protective elements 50 are electrically connected to the wiring patterns 13. The protective elements 50 are in a one-to-one correspondence with electric circuits electrically connecting one or more light-emitting elements 20.

In the light-emitting device 1, the wiring 60 is bonded to the wiring pattern 13. The light-emitting device 1 includes a plurality of wirings 60. A plurality of wirings 60 electrically connect one or more light-emitting elements 20 to the base member 10A.

One or more wirings 60 are bonded to each of the step portions 12C. A wiring 60 electrically connecting the first light-emitting element 20A to the base member 10A and a wiring 60 electrically connecting the second light-emitting element 20B to the base member 10A are bonded to different step portions 12C.

A wiring 60 bonded to a light-emitting element 20 disposed between light-emitting elements 20 at both ends among three or more light-emitting elements 20 aligned in the light-emitting device 1 is bonded to the step portion 12C partially formed on the inner lateral surface 11E. This structure facilitates wiring connections of the light-emitting elements 20 disposed at both ends. From the above viewpoint, the light-emitting device 1 including three or more, or four or more, light-emitting elements 20 is more likely to exhibit the effect of the ease of wiring connections.

In the light-emitting device 1 shown in the drawings, one or more wirings 60 (hereinafter referred to as first wiring[s]) are disposed on the first wiring pattern. One or more wirings 60 (hereinafter referred to as second wiring[s]) are disposed on the second wiring pattern. One or more wirings 60 (hereinafter referred to as third wiring[s]) are disposed on the third wiring pattern. A plurality of wirings 60 include one or more first wirings, one or more second wirings, and one or more third wirings.

In the light-emitting device 1 shown in the drawings, a wiring 60 that electrically connects a first light-emitting element 20A to the base member 10A is bonded to the upper surface of the first step portion. A wiring 60 that electrically connects a second light-emitting element 20B to the base member 10A is bonded to the upper surface of the second step portion. A wiring 60 that electrically connects a second light-emitting element 20B to the base member 10A is bonded to the upper surface of the third step portion. A wiring 60 that electrically connects a first light-emitting element 20A to the base member 10A is not bonded to the upper surface of the third step portion.

In the light-emitting device 1, the cover 70 is disposed on the upper surface of the base member 10A. The cover 70 is located above the step portion 12C. The cover 70 is bonded to define a closed space enclosed by the base member 10A and the cover 70. The light-emitting element 20 is disposed in this space.

A hermetically sealed closed space is formed by bonding the cover 70 to the base member 10A in a predetermined atmosphere. In the case in which semiconductor laser element is employed for the light-emitting element 20, the decline in quality caused by dust collection can be reduced by hermetically sealing the space in which the semiconductor laser element is disposed. The cover 70 transmits light emitted from the light-emitting element 20. Through the cover 70, 90% or more of the main portion of light emitted from the light-emitting element 20 is transmitted and emitted to the outside.

The optical member 80 is disposed over the cover 70. The optical member 80 is bonded to the cover 70. A plurality of light beams emitted from the cover 70 are incident on an incident surface of the optical member 80. The light beams incident on the incident surface of the optical member 80 are emitted from the lens surfaces.

The optical member 80 is disposed such that one or more lens surfaces respectively overlap with different light-emitting elements 20 in a top view. The main portions of light beams emitted from different light-emitting elements 20 are respectively emitted from one or more lens surfaces. A single lens surface corresponds to a single light-emitting element 20, and a light beam emitted from each light-emitting element 20 is emitted from the corresponding lens surface.

Second Embodiment

Figure 10:
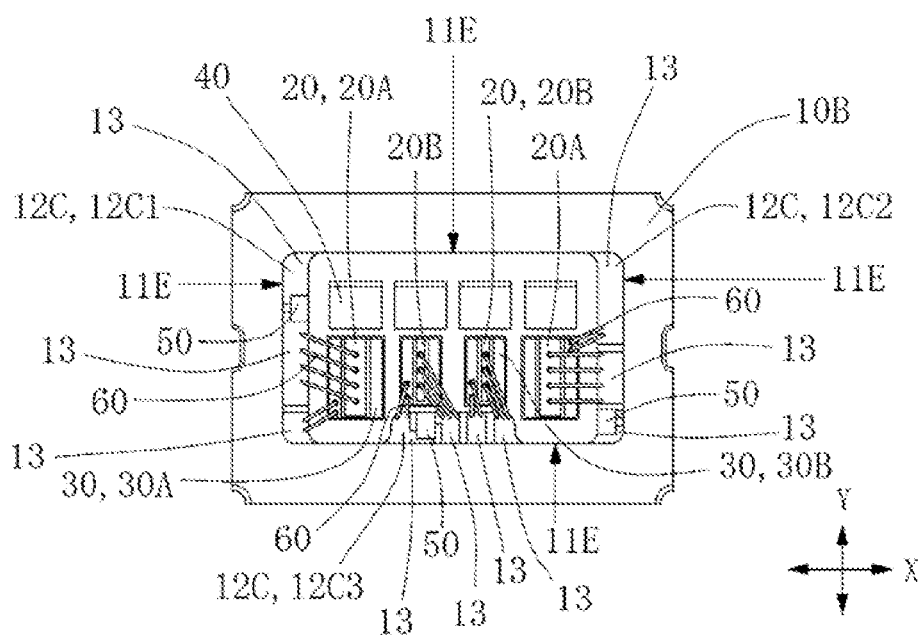
FIG. 10 is a schematic top view for illustrating each component arranged inside a light-emitting device according to the second embodiment.

A light-emitting device 2 according to a second embodiment will be described. The light-emitting device 2 differs from the light-emitting device 1 in the step portion 12C. FIG. 10 illustrates an illustrative embodiment of the light-emitting device 2. FIG. 10 is a schematic top view for illustrating each component arranged inside the light-emitting device 2. FIG. 1 to FIG. 4 also illustrate the light-emitting device 2.

The light-emitting device 2 includes a plurality of components. The components include a base member 10B, one or more light-emitting elements 20, one or more submounts 30, one or more reflective members 40, one or more protective elements 50, a plurality of wirings 60, the cover 70, and the optical member 80.

Descriptions of the light-emitting device 1 and components according to the first embodiment except for descriptions inconsistent with the drawings in FIGS. 1 to 4 and FIG. 10 showing the light-emitting device 2 apply to the description of the light-emitting device 2. Descriptions that are consistent between these embodiments will not be repeated to avoid redundancies. The descriptions of the base member 10A in the first embodiment except for descriptions inconsistent with descriptions in the drawing of FIG. 10 showing the base member 10B in the second embodiment also apply to the description of the base member 10B.

Base Member 10B

In the base member 10B, a step portion 12C formed along a portion of an inner lateral surface 11E is not integrally formed with a step portion 12C formed along an adjacent inner lateral surface 11E. In a direction along one or more inner lateral surfaces 11E, the step portion 12C formed along a portion of the inner lateral surface 11E is spaced apart from the step portion 12C formed along the adjacent inner lateral surface 11E.

In the base member 10B, the step portion 12C formed along a portion of the inner lateral surface 11E is perpendicular to the inner lateral surface 11E and formed across a virtual straight line (hereinafter referred to as a third virtual line) passing through the midpoint of the inner lateral surface 11E in a top view.

Light-Emitting Device 2

In the light-emitting device 2 shown in the drawings, a wiring 60 that electrically connects a first light-emitting element 20A to the base member 10B is bonded to the upper surface of the first step portion. A wiring 60 that electrically connects a first light-emitting element 20A to the base member 10B is bonded to the upper surface of the second step portion. A wiring 60 that electrically connects a second light-emitting element 20B to the base member 10B is bonded to the upper surface of the third step portion. A wiring 60 that electrically connects a second light-emitting element 20B to the base member 10B is not connected to the upper surface of the first step portion or the second step portion. A wiring 60 that electrically connects a first light-emitting element 20A to the base member 10B is not bonded to the upper surface of the third step portion.

As shown by the base member 10A and the base member 10B, the step portion 12C formed on a portion of the inner lateral surface 1/ E can be formed at an appropriate position according to the arrangement of the first light-emitting elements 20A and the second light-emitting elements 20B. By adjusting the position of the step portion 12C as described above, the light-emitting device can be reduced in the size according to the positions of a plurality of light-emitting elements 20.

Third Embodiment

Figure 11:
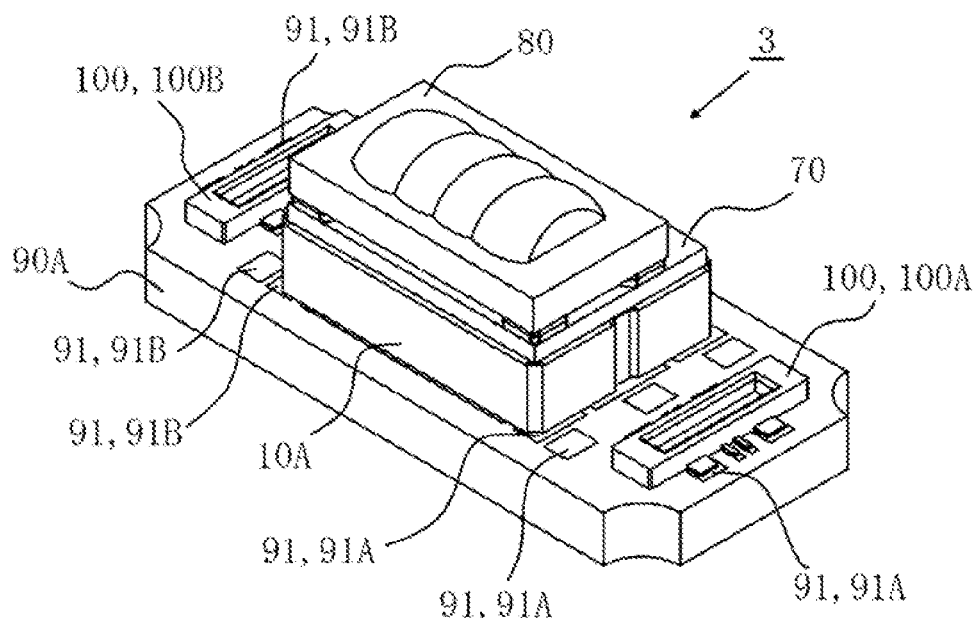
FIG. 11 is a schematic perspective view of a light-emitting device according to a third embodiment.
Figure 12:
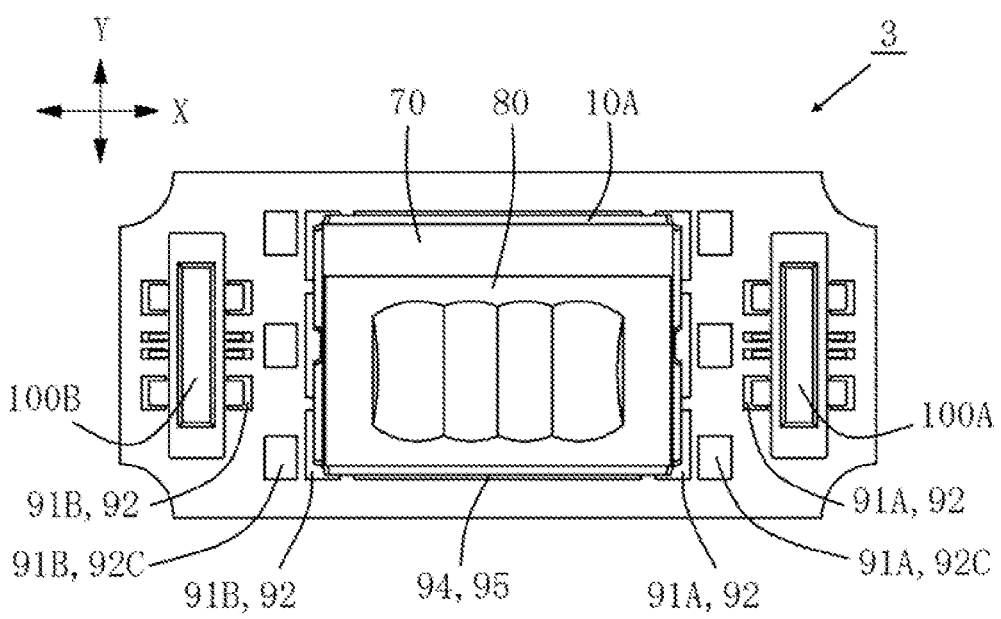
FIG. 12 is a schematic top view of the light-emitting device according to the third embodiment.
Figure 13:
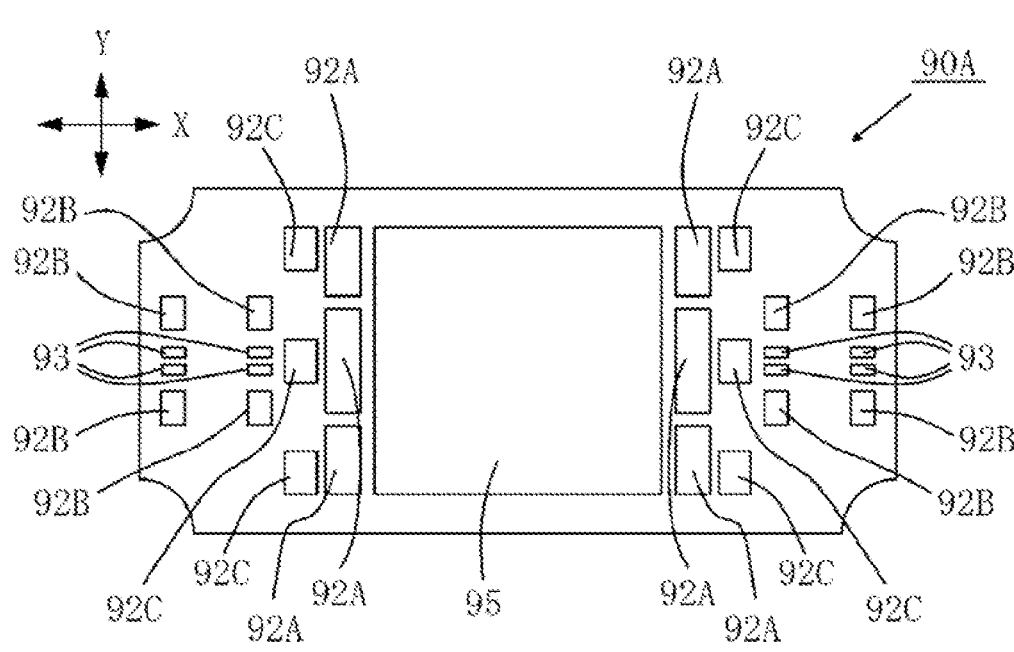
FIG. 13 is a schematic top view of a wiring substrate according to the third embodiment.
Figure 14:
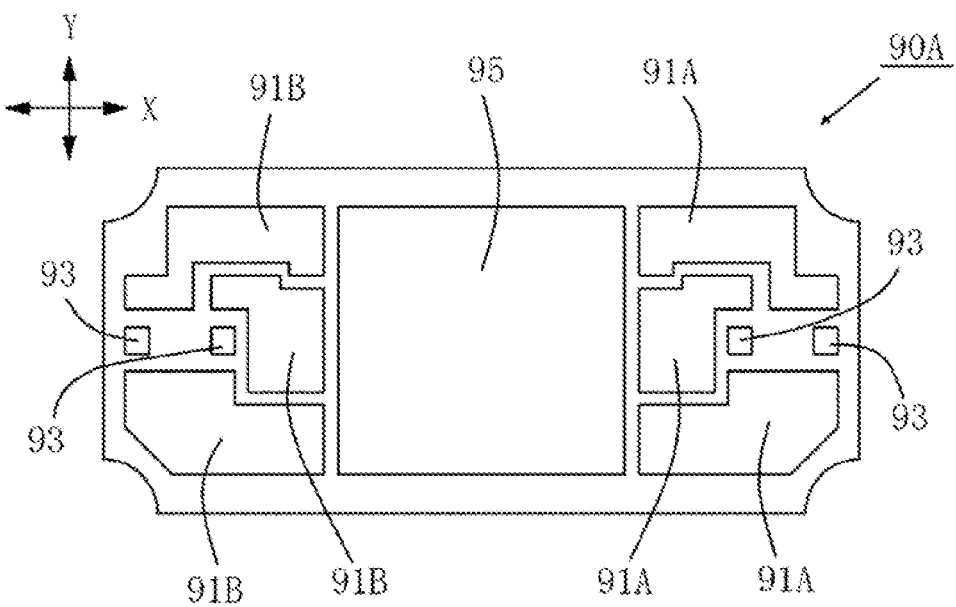
FIG. 14 is a diagram for illustrating wiring of the wiring substrate according to the third embodiment.

A light-emitting device 3 according to a third embodiment will be described. The light-emitting device 3 includes a wiring substrate 90A and a connector 100 in addition to the light-emitting device 1 or the light-emitting device 2. Accordingly, the descriptions of the light-emitting device 1 and the light-emitting device 2 also apply to the light-emitting device 3, and FIG. 1 to FIG. 10 also illustrate the light-emitting device 3. FIG. 11 to FIG. 14 illustrate an illustrative embodiment of the light-emitting device 3. FIG. 11 is a schematic perspective view of the light-emitting device 3. FIG. 12 is a schematic top view of the light-emitting device 3. FIG. 13 is a schematic top view of the wiring substrate 90A. FIG. 14 is a diagram for illustrating wiring of the wiring substrate 90A.

The light-emitting device 3 includes a plurality of components. These components include all the components included in the light-emitting device 1 or all the components included in the light-emitting device 2, the wiring substrate 90A, and the connector 100. The light-emitting device 3 does not necessarily include all the components of the light-emitting device 1 or the light-emitting device 2. Components that do not have technical features of the components of the light-emitting device 1 or the light-emitting device 2 but share common fundamental structures or materials with the components may be included.

Wiring Substrate 90A

The wiring substrate 90A has an upper surface and a lower surface. The wiring substrate 90A is provided with a plurality of wiring patterns 91. The outer periphery of the wiring substrate 90A has a rectangular shape in a top view. This rectangular shape can have long sides and short sides. In the wiring substrate 90A shown in the drawings, the long side direction of the rectangular shape coincides with the X direction, and the short side direction coincides with the Y direction. The outer periphery of the wiring substrate 90A does not necessarily have a rectangular shape in a top view.

Each wiring pattern 91 includes a plurality of bonding regions 92 spaced apart from each other on the upper surface of the wiring substrate 90A. The bonding regions 92 include a first bonding region 92A and a second bonding region 92B. For example, a plurality of bonding regions 92 spaced apart from each other in a top view can be provided by partially disposing an insulating layer on the wiring pattern 91.

Each wiring pattern 91 further includes a conductive region 92C on the upper surface of the wiring substrate 90A. The upper surface of the wiring substrate 90A is provided with one or more bonding patterns 93 other than the bonding regions 92 of the wiring patterns 91. The upper surface of the wiring substrate 90A includes a bonding surface 95 bonded to other components. The bonding surface 95 is spaced apart from the wiring patterns 91.

The wiring substrate 90A further includes a heat dissipation member 94. The heat dissipation member 94 is exposed on the upper surface and the lower surface to form a heat dissipation path from the upper surface to the lower surface. The heat dissipation member 94 can have the bonding surface 95.

A plurality of wiring patterns 91 include a first wiring pattern 91A and a second wiring pattern 91B. The bonding surface 95 is located between the first wiring pattern 91A and the second wiring pattern 91B in a top view. The first wiring pattern 91A and the second wiring pattern 91B are symmetrical about the bonding surface 95. The first wiring pattern 91A and the second wiring pattern 91B are spaced apart from each other in a third direction. In the wiring substrate 90A shown in the drawings, the third direction coincides with the X direction.

The wiring patterns 91 can include a plurality of first wiring patterns 91A. The wiring patterns 91 can include a plurality of second wiring patterns 91B. First bonding regions 92A of a plurality of first wiring patterns 91A are aligned. First bonding regions 92A of a plurality of second wiring patterns 91B are aligned.

In the wiring substrate 90A shown in the drawings, the direction (fourth direction) in which first bonding regions 92A of a plurality of first wiring patterns 91A are aligned coincides with the Y direction. The direction in which first bonding regions 92A of a plurality of second wiring patterns 91B are aligned coincides with the Y direction.

In each wiring pattern 91, the first bonding region 92A is closer to the bonding surface 95 than the second bonding region 92B. The first bonding region 92A is closer to the bonding surface 95 than the conductive region 92C. In the wiring pattern 91, the first bonding region 92A, the conductive region 92C, and the second bonding region 92B are located in this order from the side close to the bonding surface 95. The conductive region 92C is located between the first bonding region 92A and the second bonding region 92B in a top view.

In the wiring pattern 91, the conductive region 92C is disposed between a virtual line passing through a point on the first bonding region 92A farthest from the bonding surface 95 and perpendicular to the third direction in a top view and a virtual line passing through a point on the second bonding region 92B closest to the bonding surface 95 and perpendicular to the third direction in a top view.

The conductive region 92C of the first wiring pattern 91A is provided in a region between a virtual line passing through one of both ends in the fourth direction of a plurality of first bonding regions 92A aligned in the fourth direction and parallel to the third direction and a virtual line passing through the other end and parallel to the third direction. The conductive region 92C of the first wiring pattern 91A is not provided outside this region. The conductive region 92C of the second wiring pattern 91B is also not provided outside this region. By providing the conductive regions 92C in this way, the length of the wiring substrate 90A in the fourth direction can be reduced.

A bonding pattern 93 is provided between second bonding regions 92B of two first wiring patterns 91A. Another bonding pattern 93 is provided between second bonding regions 92B of two second wiring patterns 91B.

The wiring patterns 91 are formed of an electroconductive material such as metal. The heat dissipation member 94 can be formed of a metal as the main material. In view of the advantages of good heat dissipation performance and ease of processing, the heat dissipation member 94 is preferably formed of copper. The heat dissipation member 94 may contain a material other than metal or may be formed using a material other than metal as the main material.

Connector 100

The connector 100 includes a connection port and a bonding portion. The connection port is a portion into which a connecting terminal is inserted. The connecting terminal is inserted into the connection port to establish an electrical connection to the outside. The connection port is located opposite to the bonding portion of the connector 100. The position of the connection port is not limited to the position opposite to the bonding portion of the connector 100.

Light-Emitting Device 3

In the light-emitting device 3, the base member 10A is disposed on the wiring substrate 90A. The base member 10A is bonded to the bonding surface 95 of the wiring substrate 90A. The lower surface of the base member 10A is bonded to the bonding surface 95 of the wiring substrate 90A. The lower portion 12A of the base member 10A is bonded to the bonding surface 95, but the lateral portion 12B is not bonded to the bonding surface 95.

The base member 10A is electrically connected to the first bonding region 92A of the first wiring pattern 91A. The base member 10A is electrically connected to the first bonding region 92A of the second wiring pattern 91B. The base member 10A is bonded to the first bonding region 92A. The lateral portion 12B of the base member 10A is bonded to the first bonding region 92A, but the lower portion 12A is not bonded to the first bonding region 92A. The wiring pattern 13 of the base member 10A are electrically connected to the wiring pattern 91 of the wiring substrate 90A.

A plurality of light-emitting elements 20 disposed on the base member 10A are aligned in the long side direction of the wiring substrate 90A in a top view. In the light-emitting device 3 shown in the drawings, light beams respectively emitted from a plurality of light-emitting elements 20 and emitted from the cover 70 upward have the slow axis direction parallel to the long side direction of the wiring substrate 90A and the fast axis direction parallel to the short side direction of the wiring substrate 90A. The long side direction of the base member 10A coincides with the long side direction of the wiring substrate 90A, and the short side direction of the base member 10A coincides with the short side direction of the wiring substrate 90A in atop view. Aligning the long side directions and the short side directions of the base member 10A and the wiring substrate 90A can allow for the reduction in the size of the light-emitting device 3.

In the light-emitting device 3, one or more connectors 100 are disposed on the wiring substrate 90A. The connector 100 is bonded to the second bonding region[s] 92B of the wiring substrate 90A. The connector 100 is bonded to the bonding pattern 93 of the wiring substrate 90A. The bonding portion of the connector 100 is bonded to the wiring substrate 90A.

One or more connectors 100 include a first connector 100A and a second connector 100B. The first connector 100A is bonded to the second bonding region[s]92B of the first wiring pattern[s] 91A. The second connector 100B is bonded to the second bonding region[s] 92B of the second wiring pattern[s] 91B. A virtual straight line passing through the first connector 100A and the second connector 100B passes through the base member 10A in atop view.

The first connector 100A is bonded to second bonding regions 92B of a plurality of first wiring patterns 91A. The second connector 100B is bonded to second bonding regions 92B of a plurality of second wiring patterns 91B.

In one example, the first connector 100A is connected to the first light-emitting element 20A and the second light-emitting element 20B. The second connector 100B is connected to the first light-emitting element 20A and the second light-emitting element 20B. The first connector 100A is connected to one electrode (for example, a positive electrode) of electrodes of each light-emitting element 20, and the second connector 100B is connected to another electrode (for example, a negative electrode) of the electrodes of the respective light-emitting element 20. With the connecters 100 each connected to the electrodes of the same polarity allows for facilitating connection to the power source.

The first connector 100A is electrically connected to not only the first light-emitting element 20A, which is disposed in a region including the first connector 100A, but also to the second light-emitting element 20B, which is disposed in a region not including the first connector 100A, when the mounting surface 11D of the light-emitting device 3 is divided into two portions in a top view by a virtual line perpendicular to the third direction. The second connector 100B is electrically connected to not only the second light-emitting element 20B, which is disposed in a region including the second connector 100B in a top view, but also to the first light-emitting element 20A, which is disposed in a region not including the second connector 100B in a top view.

In another example, the first connector 100A is electrically connected to the first light-emitting element 20A. The second connector 100B is electrically connected to the second light-emitting element 20B. The first connector 100A is not electrically connected to the second light-emitting element 20B, and the second connector 100B is not electrically connected to the first light-emitting element 20A. As described above, power is applied separately to a plurality of light-emitting elements 20 using the first connector 100A and the second connector 100B. This constitution can reduce the size of the light-emitting device 3 in a direction perpendicular to the third direction in a top view.

When the mounting surface 11D of the light-emitting device 3 is divided into two portions in a top view by a virtual line perpendicular to the third direction, one or more light-emitting elements 20 disposed in the region including the first connector 100A are electrically connected to the first connector 100A, and one or more light-emitting elements 20 disposed in the region including the second connector 100B are electrically connected to the second connector 100B.

In the light-emitting device 3 shown in the drawings, this relationship holds in a region divided into two portions by a virtual line passing through the midpoint of the mounting surface 11D in the third direction and perpendicular to the third direction. Half of the number of a plurality of light-emitting elements 20 disposed on the mounting surface 11D is electrically connected to the first connector 100A, and the other half of the plurality of light-emitting elements 20 is electrically connected to the second connector 100B. In the case in which the number of the light-emitting elements 20 disposed on the mounting surface 11D is an odd number, the number of the light-emitting elements 20 is greater in either region by one, but this case is also included in the term "half."

For example, the conductive region 92C can be used for testing electrical connections between the light-emitting element 20A and the wiring substrate 90A.

Fourth Embodiment

Figure 15:
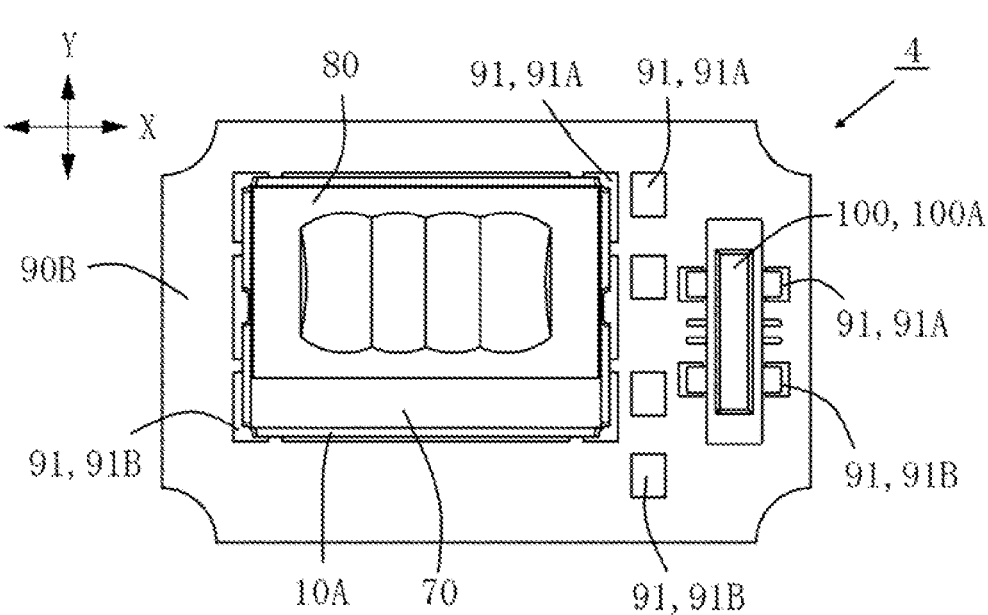
FIG. 15 is a schematic top view of a light-emitting device according to a fourth embodiment.
Figure 16:
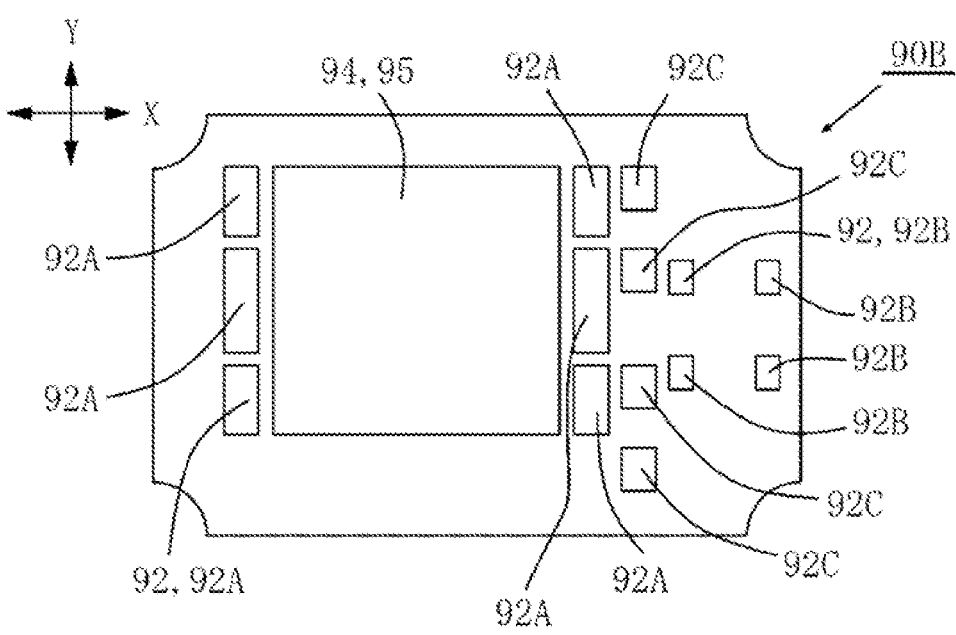
FIG. 16 is a schematic top view of a wiring substrate according to the fourth embodiment.

A light-emitting device 4 according to a fourth embodiment will be described. The light-emitting device 4 includes a wiring substrate 90B and the connector 100 in addition to the light-emitting device 1 or the light-emitting device 2. Accordingly, the descriptions of the light-emitting device 1 and the light-emitting device 2 also apply to the light-emitting device 4, and FIG. 1 to FIG. 10 also illustrate the light-emitting device 3. The wiring substrate 90B of the light-emitting device 4 differs from the wiring substrate 90A of the light-emitting device 3. FIG. 15 to FIG. 17 illustrate an illustrative embodiment of the light-emitting device 4. FIG. 15 is a schematic top view of the light-emitting device 4. FIG. 16 is a schematic top view of the wiring substrate 90B. FIG. 17 is a diagram for illustrating wiring of the wiring substrate 90B.

All the contents of descriptions of the light-emitting device 3 and each component according to the third embodiment other than contradictions specified on the basis of the drawings in FIG. 15 to FIG. 17 showing the light-emitting device 4 apply to the description of the light-emitting device 4. All the contents without contradiction are not described again to avoid redundancies. The descriptions of the wiring substrate 90A in the third embodiment other than contradictions specified on the basis of the drawings of FIG. 16 and FIG. 17 showing the wiring substrate 90B in the fourth embodiment also apply to the description of the wiring substrate 90B.

Wiring Substrate 90B

On the wiring substrate 90B, the bonding surface 95 is located between the first bonding region 92A and the second bonding region 92B of the second wiring pattern 91B. The distance from the second bonding region 92B of the second wiring pattern 91B to the first bonding region 92A of the first wiring pattern 91A is shorter than the distance from the second bonding region 92B of the second wiring pattern 91B to the first bonding region 92A of the second wiring pattern 91B. The distance from the second bonding region 92B of the first wiring pattern 91A to the first bonding region 92A of the first wiring pattern 91A is shorter than the distance from the second bonding region 92B of the first wiring pattern 91A to the first bonding region 92A of the second wiring pattern 91B. With this structure, the single connector 100 can establish electrical connections of the first light-emitting element 20A and the second light-emitting element 20B, so that the size of the wiring substrate 90B in the third direction can be reduced.

On the wiring substrate 90B, the conductive region 92C of the first wiring pattern 91A is provided in a region between a virtual line passing through one of both ends in the fourth direction of a plurality of first bonding regions 92A aligned in the fourth direction and parallel to the third direction and a virtual line passing through the other end and parallel to the third direction. The conductive region 92C of the second wiring pattern 91B is provided outside this region.

Each embodiment of the present invention has been described above, but the light-emitting device according to the present invention is not strictly limited by the light-emitting device of each embodiment. That is, it is not impossible to reduce the present invention into practice without limiting the present invention to the outer shape and structure of the light-emitting device disclosed referring to each embodiment. The present invention can be applied without requiring that all the components be included in a necessary and sufficient manner. For example, in the case in which some of the components of the light-emitting device disclosed referring to the embodiments is not described in the claims, design flexibility such as substitution, omission, changes in shape, and changes in material of that part of the components by a person skilled in the art is accepted, and applications of the invention described in the claims are specified in consideration of that acceptance.

The light-emitting device described in each embodiment can be used for a projector, a vehicle headlamp, a head-mounted display, a light, a display, or the like.

What is claimed is:

1. A base member comprising:
a lower portion having an upper surface; and
a lateral portion surrounding the upper surface of the lower portion in a top view, the lateral portion including
a plurality of inner lateral surfaces including a first lateral surface, a second lateral surface not adjacent to the first lateral surface and facing the first lateral surface, a third lateral surface adjacent to the first lateral surface, and a fourth surface adjacent to the first lateral surface and facing the third lateral surface, the inner lateral surfaces defining a rectangular shape in the top view with the first lateral surface and the second lateral surface being a pair of short sides and the third lateral surface and the fourth lateral surface being a pair of long sides,
a first step portion arranged inward of the first lateral surface along an entirety of the first lateral surface in the top view, the first step portion having a first upper surface provided with a wiring pattern,
a second step portion arranged inward of the second lateral surface along an entirety of the second lateral surface in the top view, the second step portion having a second upper surface provided with a wiring pattern, and
a third step portion arranged inward of the third lateral surface along only a portion of the third lateral surface in the top view, the third step portion having a third upper surface provided with a wiring pattern, wherein
the second step portion and the third step portion are spaced apart from each other in the top view,
the first step portion and the third step portion are spaced apart from each other in the top view, and
a length of the third step portion along the third lateral surface is smaller than a length of the second step portion along the second lateral surface in the top view.
2. The base member according to claim 1, wherein the third step portion has the length of 10% or more and 75% or less of a length of the third lateral surface in a direction parallel to the upper surface of the lower portion.
3. The base member according to claim 1, wherein in the top view, the length of the third step portion along the third lateral surface is 10% or more and 75% or less of the length of the second step portion along the second lateral surface.
4. The base member according to claim 1, wherein in a direction parallel to the upper surface of the lower portion, a length of the second lateral surface is 20% or more and 90% or less of a length of the third lateral surface.
5. A light-emitting device comprising:
a plurality of semiconductor laser elements including a first semiconductor laser element, and a second semiconductor laser element having a length in a first direction smaller than a length of the first semiconductor laser element in the first direction;
a base member including a lower portion having an upper surface on which the plurality of semiconductor laser elements are disposed along a second direction perpendicular to the first direction, and a lateral portion surrounding the upper surface of the lower portion in a top view, the lateral portion including
a plurality of inner lateral surfaces including a first lateral surface, a second lateral surface not adjacent to the first lateral surface and facing the first lateral surface, a third lateral surface adjacent to the first lateral surface, and a fourth lateral surface adjacent to the first lateral surface and facing the third lateral surface, the third lateral surface extending along the second direction, the inner lateral surfaces defining a rectangular shape in the top view with the first lateral surface and the second lateral surface being a pair of short sides and the third lateral surface and the fourth lateral surface being a pair of long sides,
a first step portion arranged inward of the first lateral surface along a portion of or an entirety of the first lateral surface in the top view, the first step portion having a first upper surface provided with a first wiring pattern,
a second step portion arranged inward of the second lateral surface along a portion of or an entirety of the second lateral surface in the top view, the second step portion having a second upper surface provided with a second wiring pattern, and a third step portion arranged inward of the third lateral surface along only a portion of the third lateral surface in the top view, the third step portion having a third upper surface provided with a third wiring pattern, the second step portion and the third step portion being spaced apart from each other in the top view, the first step portion and the third step portion being spaced apart from each other in the top view, and a length of the third step portion along the third lateral surface being smaller than a length of the second step portion along the second lateral surface in the top view; and a plurality of wirings electrically connecting the semiconductor laser elements to the base member, the wirings including a first wiring bonded to the first wiring pattern, a second wiring bonded to the second wiring pattern, and a third wiring bonded to the third wiring pattern, wherein each of the semiconductor laser elements having a rectangular shape with a length along the first direction being longer than a width along the second direction, and each of the semiconductor laser elements is configured to emit light in the first direction.

6. The light-emitting device according to claim 5, wherein the third step portion is located closer to the second semiconductor laser element than to the first semiconductor laser element.

7. The light-emitting device according to claim 5, wherein the first semiconductor laser element is disposed such that there is no virtual straight line perpendicular to the third lateral surface and passing through both of the third step portion and the first semiconductor laser element in the top view, and the second semiconductor laser element is disposed such that there is a virtual straight line perpendicular to the third lateral surface and passing through both of the third step portion and the second semiconductor laser element in the top view.

8. The light-emitting device according to claim 5, wherein in the top view, a shortest distance between the first second semiconductor laser element and a virtual straight line, which is parallel to the third lateral surface and which passes through a point on the third step portion farthest from the third lateral surface in a direction perpendicular to the third lateral surface, is 50 µm or greater and less than 400 µm.

9. The light-emitting device according to claim 5, wherein in the top view, a shortest distance between the third lateral surface and the first semiconductor laser element in a direction perpendicular to the third lateral surface is 50 µm or greater.

10. The light-emitting device according to claim 5, wherein in the top view, a shortest distance between the first semiconductor laser element and a virtual straight line, which is parallel to the third lateral surface and which passes through a point on the third step portion farthest from the third lateral surface in a direction perpendicular to the third lateral surface, is shorter than a shortest distance between the second semiconductor laser element and the virtual straight line.

11. The light-emitting device according to claim 5, further comprising:

a first submount on which the first semiconductor laser element is disposed, the first submount being disposed on the upper surface of the lower portion; and a second submount on which the second semiconductor laser element is disposed, the second submount being disposed on the upper surface of the lower portion and having a length in the first direction smaller than a length of the first submount in the first direction, wherein the first submount is disposed at a position in which a virtual straight line, which is parallel to the third lateral surface and which passes through a point on the third step portion farthest from the third lateral surface in a direction perpendicular to the third lateral surface, passes through the first submount in the top view.

12. The light-emitting device according to claim 5, further comprising:

a wiring substrate including a first wiring pattern and having a bonding surface, the first wiring pattern of the wiring substrate having a first bonding region, a second bonding region, and a conductive region, the bonding surface, the first bonding region, the second bonding region, and the conductive region being located on an upper surface of the wiring substrate; and a first connector bonded to the second bonding region of the first wiring pattern of the wiring substrate, wherein the base member is bonded to the bonding surface and electrically connected to the first bonding region of the first wiring pattern of the wiring substrate, and the conductive region is located between the first bonding region and the second bonding region in the top view.

13. The light-emitting device according to claim 5, further comprising:

a wiring substrate including a plurality of wiring patterns including the first wiring pattern of the wiring substrate and a second wiring pattern and having a bonding surface, each of the plurality of wiring patterns having a first bonding region and a second bonding region, the bonding surface, the first bonding region, and the second bonding region being located on an upper surface of the wiring substrate;

a first connector bonded to the second bonding region of the first wiring pattern of the wiring substrate; and a second connector bonded to the second bonding region of the second wiring pattern of the wiring substrate, wherein the base member is bonded to the bonding surface and electrically connected to the first bonding region of the first wiring pattern of the wiring substrate and the first bonding region of the second wiring pattern of the wiring substrate, the base member is disposed between the first connector and the second connector in the top view, and the first light-emitting element and the second semiconductor laser element are disposed in a direction in which the first connector, the base member, and the second connector are aligned in the top view.

* * * * *